(12) United States Patent
Furusho

(10) Patent No.: US 6,181,564 B1
(45) Date of Patent: Jan. 30, 2001

(54) IC CARD

(75) Inventor: Hidetaka Furusho, Miyagi-ken (JP)

(73) Assignee: Alps Electric Co., Ltd., Tokyo (JP)

( * ) Notice: Under 35 U.S.C. 154(b), the term of this patent shall be extended for 0 days.

(21) Appl. No.: 09/337,378

(22) Filed: Jun. 21, 1999

(30) Foreign Application Priority Data

Jun. 26, 1998 (JP) .................................................. 10-180482

(51) Int. Cl.⁷ ...................................................... H05K 9/00

(52) U.S. Cl. .......................... 361/737; 361/753; 361/799; 361/801; 361/800; 439/946; 235/492

(58) Field of Search ..................................... 361/728, 736, 361/737, 752–759, 799, 801, 810; 257/679; 235/492; 439/946; 220/4.02; 248/560

(56) References Cited

U.S. PATENT DOCUMENTS

| | | | |
|---|---|---|---|
| 5,111,362 | * 5/1992 | Flamm et al. | 361/737 X |
| 5,339,222 | 8/1994 | Simmons et al. . | |
| 5,477,421 | * 12/1995 | Bethurum | 361/818 |
| 5,502,620 | * 3/1996 | Funck et al. | 361/753 |
| 5,563,450 | * 10/1996 | Bader et al. | 257/785 |

\* cited by examiner

*Primary Examiner*—Jayprakash N. Gandhi
(74) *Attorney, Agent, or Firm*—Brinks Hofer Gilson & Lione

(57) ABSTRACT

In the IC card of the present invention, a substrate member received in an accommodating portion of a case is held grippingly between an upper cover and a lower cover, therefore, the conventional frame is not needed. Thus, the IC card of the invention is superior in productivity and is less expensive.

5 Claims, 5 Drawing Sheets

IC CARD

BACKGROUND OF THE INVENTION

1. Field of the Invention

The present invention relates to an IC card for use, for example, in communication through a LAN and a modem.

2. Description of the Related Art

A conventional IC card will now be described with reference to FIGS. 10 to 12. A rectangular lower cover 21 formed of a metallic plate has a base portion 21a which is in the shape of a flat plate, side walls 21b formed on both sides of the base portion 21a by bending, and a rear wall 21c formed at the rear of the base portion 21a by bending.

A rectangular upper cover 22 formed of a metallic plate has a base portion 22a which is in the shape of a flat plate, side walls 22b formed on both sides of the base portion 22a by bending, a rear wall 22c formed at the rear of the base portion 22a by bending, and an arm portion 22d extending inwards from a side wall 22b.

A rectangular frame 23 formed by molding with use of a synthetic resin has frame portions 23a disposed throughout the whole periphery of the rectangular shape, a rectangular receptacle portion 23b formed as a concave portion inside the frame portions 23a, and stepped portions 23c formed in the receptacle portion 23b.

The frame 23 has a size which is almost the same as the external form of the base portion 21a of the lower cover 21, and it is placed on the base portion 21a while being received within the lower cover 21. The frame 23 is secured to the lower cover 21, for example, by bending the side walls 21b.

A substrate member 25 having a conductive pattern (not shown) and various electric components 24 attached thereto is placed on the stepped portions 23c of the frame 23 and in this state it is received in the receptacle portion 23b of the frame. The whole periphery of the substrate member 25 is established its position by the receptacle portion 23b.

The socket 26 is constituted by a female type socket forming part of a connector and it has a terminal (not shown) to be connected to a terminal (not shown) of a male connector. The socket 26 is positioned at the front portion of the frame 23 and in this state the terminal thereof is connected to the conductive pattern on the substrate member 25.

The lower cover 21 and the upper cover 22, with the substrate member 25 and the socket 26 mounted thereto, are combined together to form a case 27 having an accommodating portion 27a.

When the case 27 is formed, the frame 23, substrate member 25 and socket 26 are accommodated within the accommodating portion 27a and the arm portion 22d of the upper cover 22 comes into contact with an earth pattern of the conductive pattern.

The IC card constructed as above is inserted into and ejected from an IC card connector.

There are several types of such IC cards respectively having substrate members 25 with different electric components 24 mounted thereon. The electric components 24 are different in height, thus giving rise to the necessity that the supporting position be changed for each substrate member 25 in the vertical direction of the case 27.

According to the prior art, several types of frames 23 different in the height of stepped portions 23c are provided, whereby substrate members 25 having electric components 24 of different heights can each be accommodated in the case 23.

In the conventional IC card, since the frame 23 for supporting the substrate member 25 has a size equal to that of the base portion 21a of the lower cover 21, the frame 23 is large in size and therefore the material cost and the manufacturing cost become high. Moreover, different frames 23 are required depending on the type of IC card used, thus giving rise to the problem that the cost of IC card becomes extremely high.

SUMMARY OF THE INVENTION

According to the first arrangement adopted by the present invention for solving the above-mentioned problems there is provided an IC card comprising an upper cover formed of a metallic plate, a lower cover formed of a metallic plate, a substrate member having a conductive pattern and various electric components, and a socket connected to the conductive pattern, wherein the upper cover and the lower cover are combined together to form a case having an accommodating portion, the socket is attached to a front side of the case, and the substrate member is received in the accommodating portion and is held grippingly between the upper cover and the lower cover.

According to the second arrangement adopted by the invention there is provided, in combination with the above first arrangement, an IC card wherein one of the upper and lower covers is provided with a plurality of receiving portions, while the other cover is provided with a plurality of presser arm portions, and side portions of the substrate member are held grippingly between the receiving portions and the presser arm portions.

According to the third arrangement adopted by the invention there is provided, in combination with the above second arrangement, an IC card wherein the receiving portions each have a plurality of stepped portions in the vertical direction of the case so that various substrate members as mentioned above can be supported on the stepped portions respectively.

According to the fourth arrangement adopted by the invention there is provided, in combination with the above second means, an IC card wherein support members formed of a synthetic resin are attached to the front side of the case to support the side portions of the substrate member at front positions thereof, and the side portions of the substrate member are supported at rear positions thereof by both the receiving portions and the presser arm portions.

According to the fifth arrangement adopted by the invention there is provided, in combination with the above second arrangement, an IC card wherein the rear portion of the upper cover or the lower cover is provided with a support portion for supporting the rear portion of the substrate member.

According to the sixth arrangement adopted by the invention there is provided, in combination with the above second arrangement, an IC card wherein the receiving portions and/or the presser arm portions are brought into contact with an earth pattern of the conductive pattern.

DETAILED DESCRIPTION OF PREFERRED EMBODIMENTS

Figure 1:
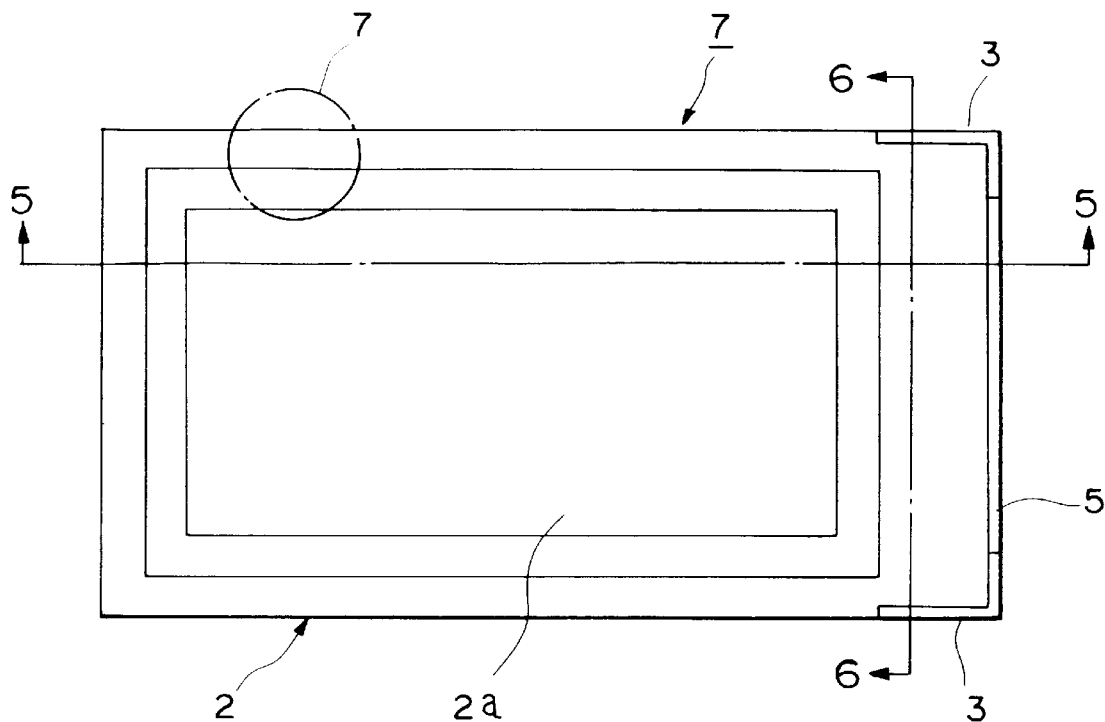
FIG. 1 is a plan view of an IC card according to an embodiment of the present invention.
Figure 2:
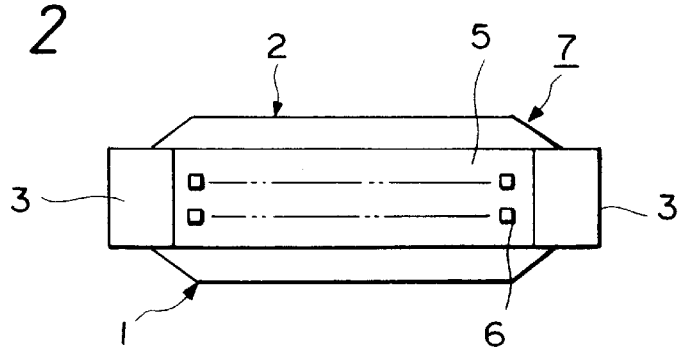
FIG. 2 is a front view thereof.
Figure 3:
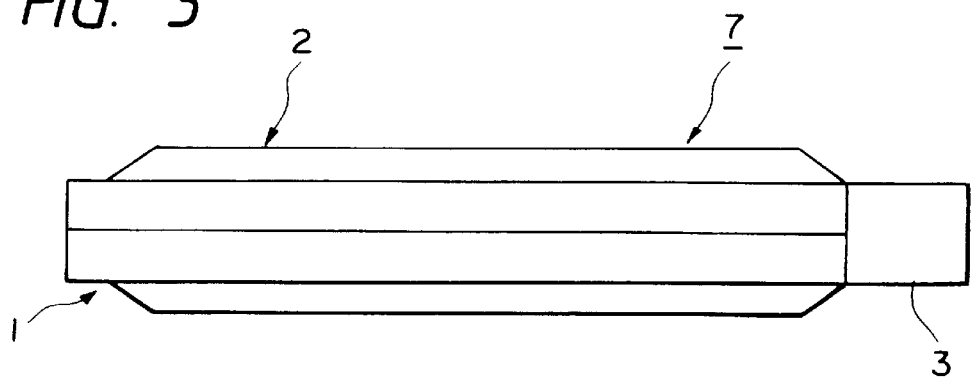
FIG. 3 is a side view thereof.
Figure 4:
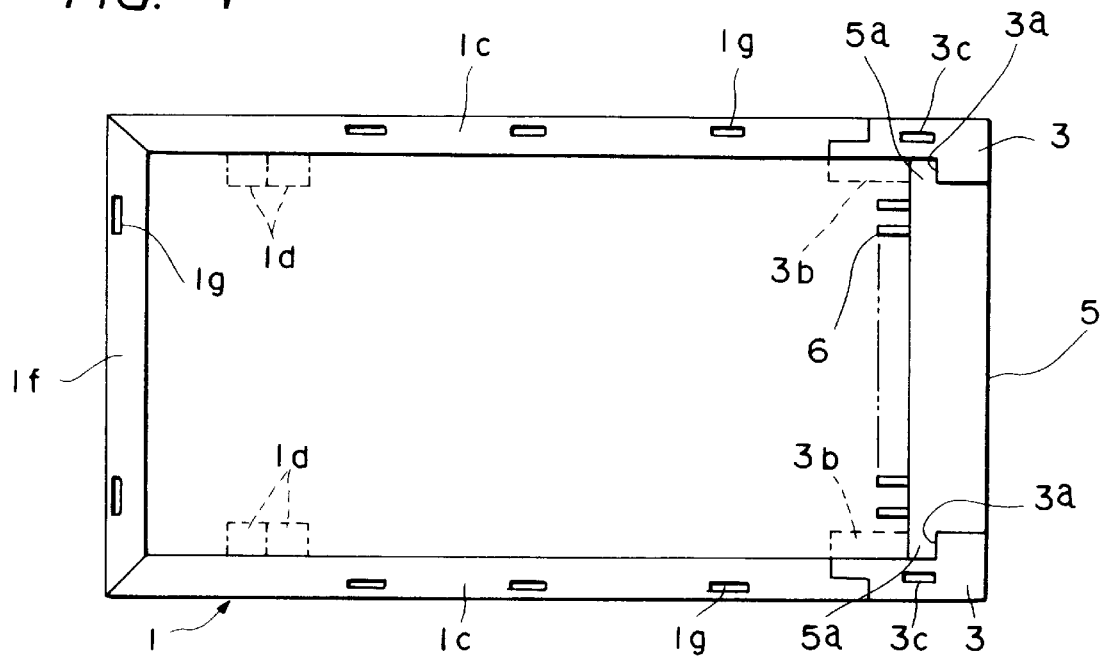
FIG. 4 is a plan view similar to FIG. 1, with an upper cover removed.
Figure 5:
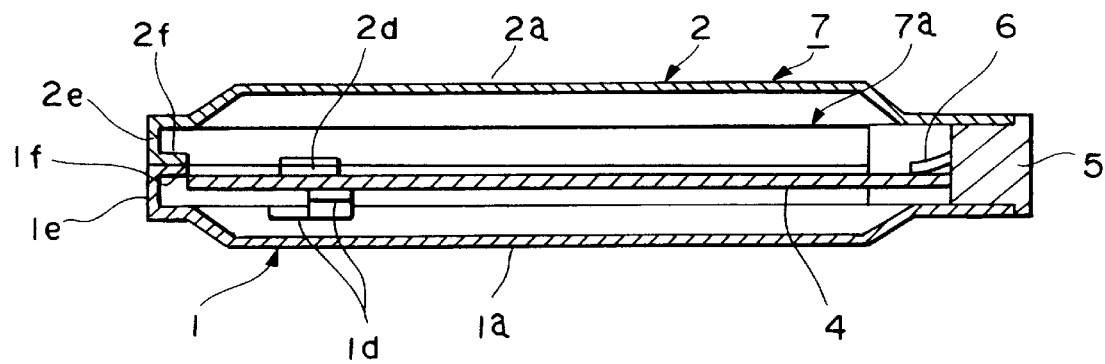
FIG. 5 is a sectional view taken on line 5—5 in FIG. 1.
Figure 6:
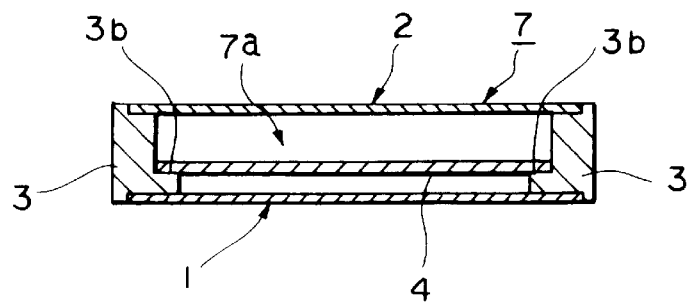
FIG. 6 is a sectional view taken on line 6—6 in FIG. 1.
Figure 7:
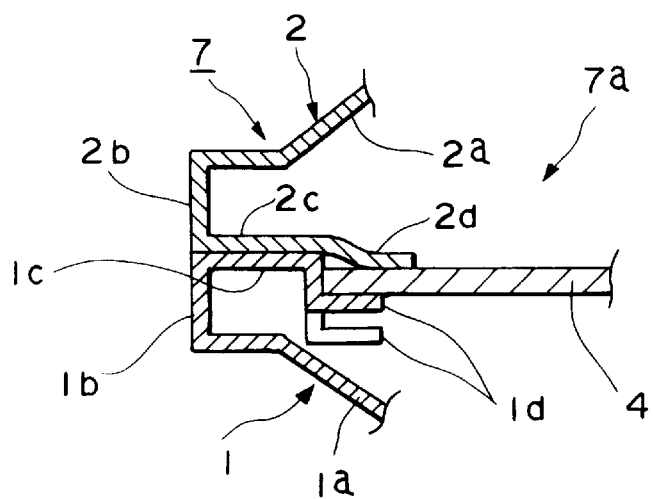
FIG. 7 is a sectional view of a portion 7 in FIG. 1.
Figure 8:
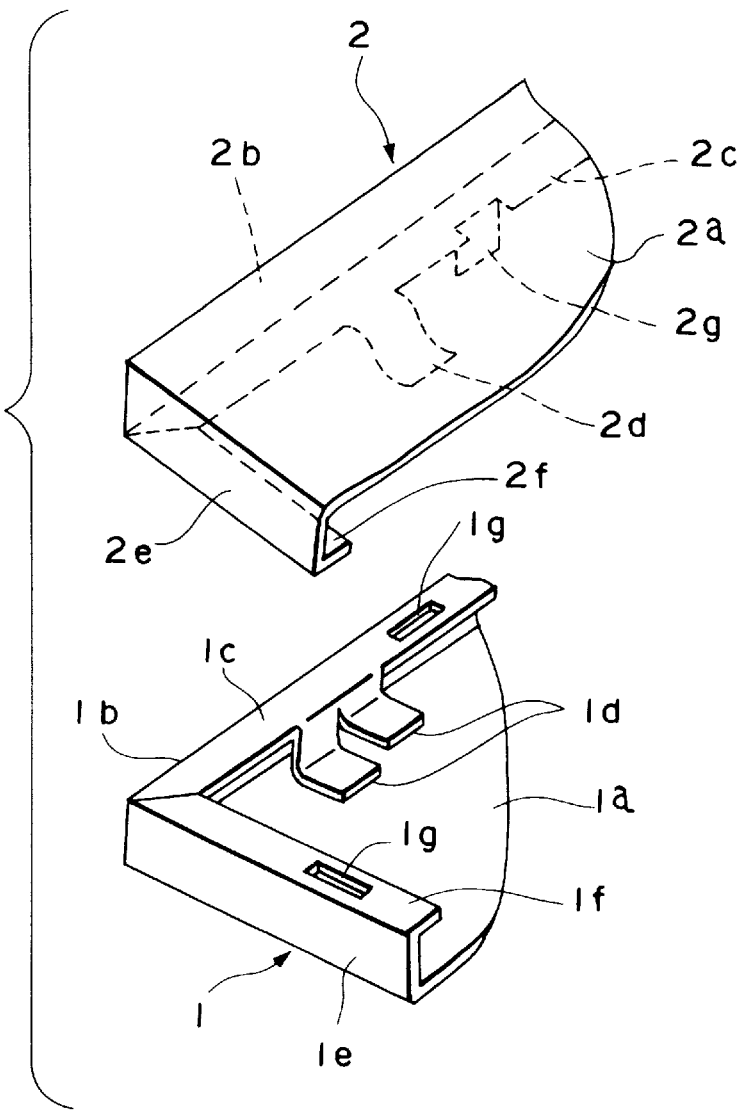
FIG. 8 is an exploded perspective view showing principal portions of an upper cover and a lower cover both used in the IC card.
Figure 9:
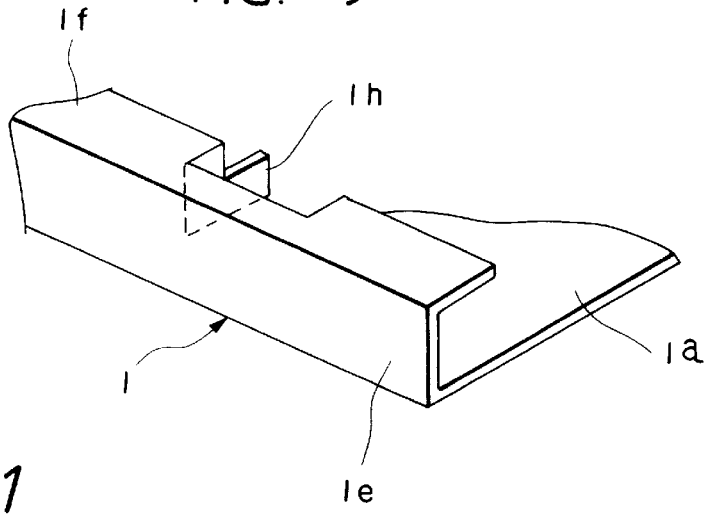
FIG. 9 is a perspective view showing a principal portion of a lower cover used in an IC card according to another embodiment of the present invention.
Figure 11:
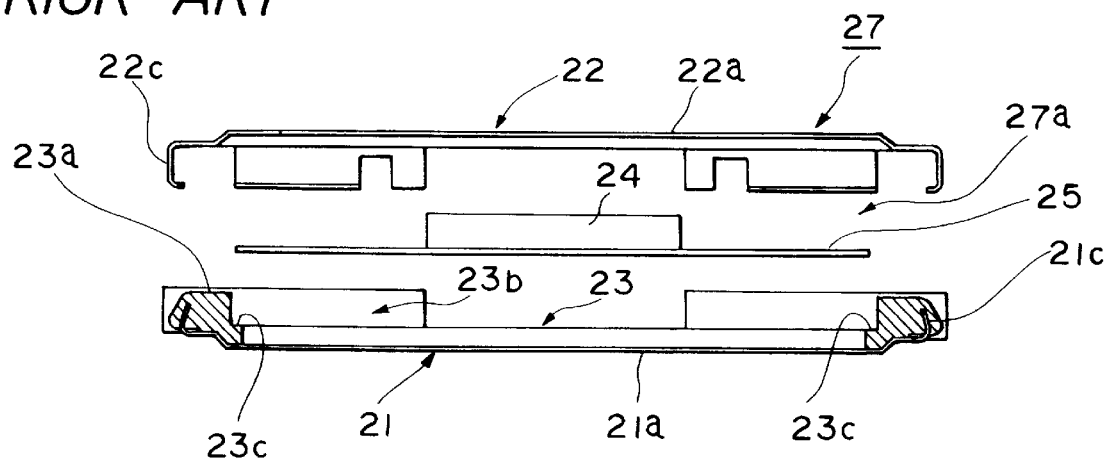
FIG. 11 is an exploded side view thereof.
Figure 12:
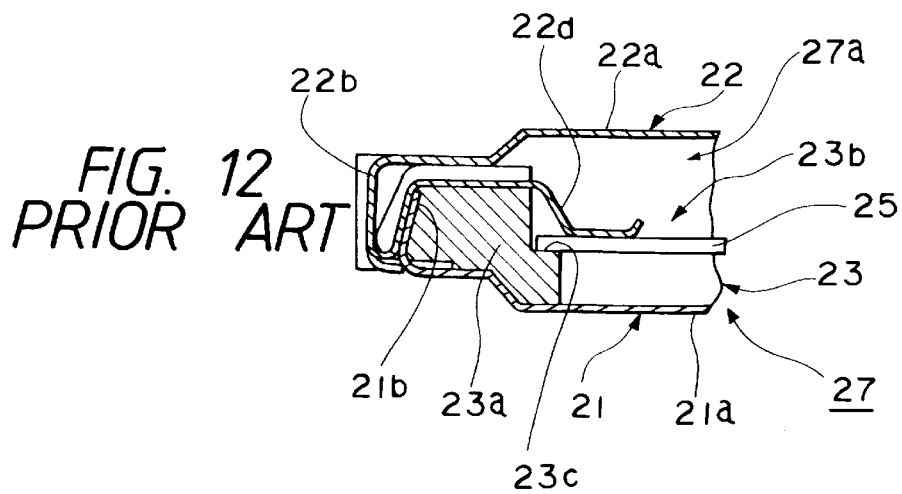
FIG. 12 is a sectional view of a principal portion thereof.
Figure 10:
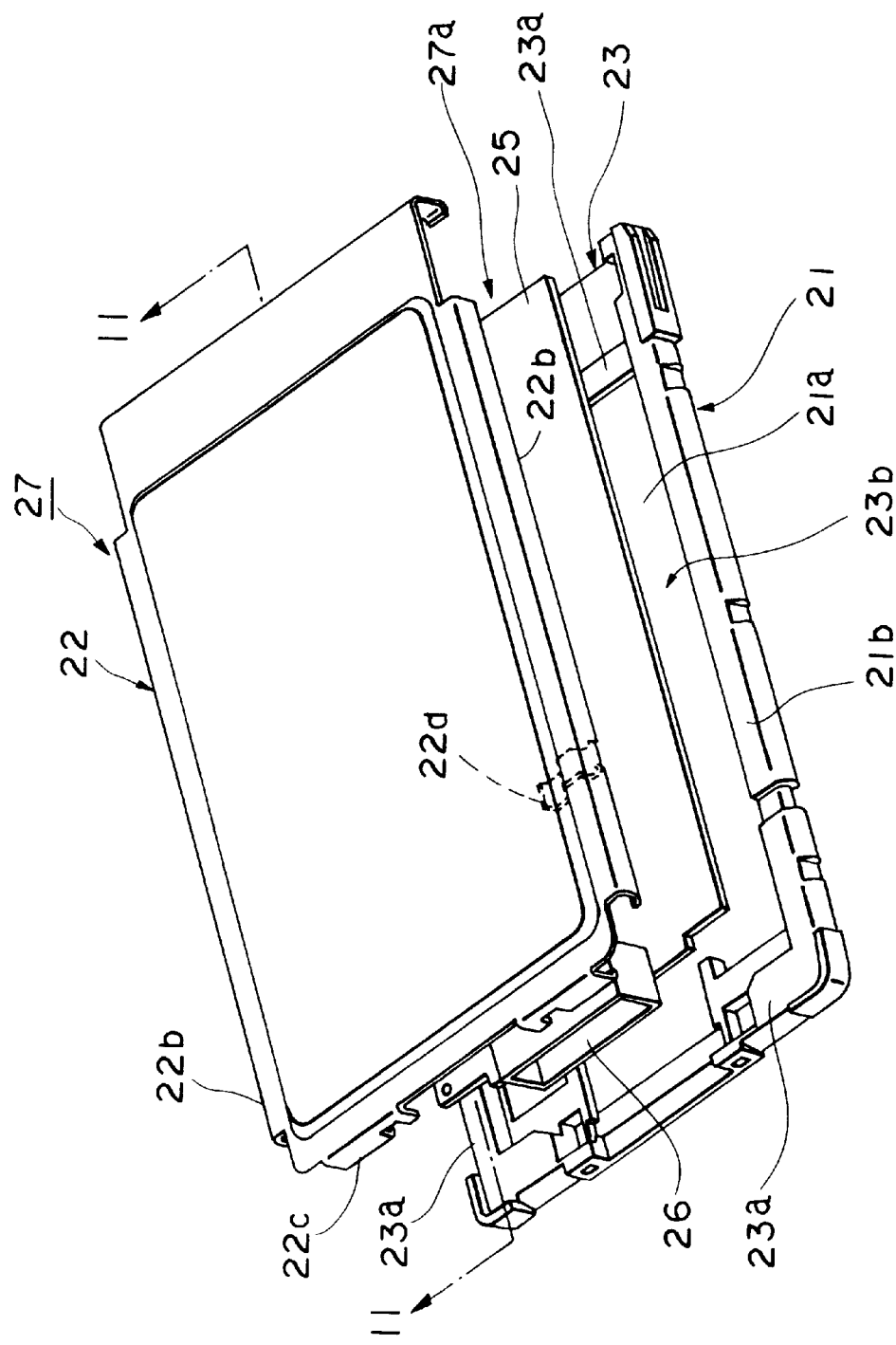
FIG. 10 is an exploded perspective view of a conventional IC card.

IC cards embodying the present invention will be described below with reference to FIGS. 1 to 9, of which FIG. 1 is a plan view of an IC card according to an embodiment of the present invention, FIG. 2 is a front view thereof, FIG. 3 is a side view thereof, FIG. 4 is a plan view similar to FIG. 1, with an upper cover removed, FIG. 5 is a sectional view taken on line 5—5 in FIG. 1, FIG. 6 is a sectional view taken on line 6—6 in FIG. 1, FIG. 7 is a sectional view of a portion 7 in FIG. 1, FIG. 8 is an exploded perspective view showing principal portions of an upper cover and a lower cover both used in the IC card, and FIG. 9 is a perspective view showing a principal portion of a lower cover used in an IC card according to another embodiment of the present invention.

An IC card according to an embodiment of the present invention will now be described with reference to FIGS. 1 to 8. A rectangular lower cover 1 formed of a metallic plate comprises a base portion 1a having an expanded portion, side walls 1b formed at both side positions of the base portion 1 a by bending, frames 1c bent inwards from end portions of the side walls 1b so as to become opposed to the base portion 1a, a plurality of receiving portions 1d having a plurality of stepped portions, the receiving portions 1d being bent in L shape toward the base portion 1a from rear end portions of the frames 1c, a rear wall 1e formed at the rear of the base portion 1a by bending, a frame 1f bent inwards from an end portion of the rear wall 1e so as to be opposed to the base portion 1a, and a plurality of rectangular holes 1g formed in the frames 1c and 1f.

A rectangular upper cover 2 formed of a metallic plate comprises a base portion 2a having an expanded portion, side walls 2b formed at both side positions of the base portion 2a by bending, frames 2c bent inwards from end portions of the side walls 2b so as to be opposed to the base portion 2a, arm portions 2d extending inwards from rear ends of the frames 2c, a rear wall 2e formed at the rear of the base portion 2a by bending, a frame 2f bent inwards from an end portion of the rear wall 2e so as to be opposed to the base portion 2a, and a plurality of rectangular projections 2g formed in the frames 2c, 2f and each having a retaining portion such as a convex portion.

The arm portions 2d and the receiving portions 1d come to be opposed to each other and the projections 2g each having a retaining portion can be inserted respectively into the holes 1g.

Although in the above construction the receiving portions 1d and the arm portions 2d are provided in the lower cover 1 and the upper cover 2, respectively, the arm portions may be provided in the upper cover and the receiving portions in the lower cover. Further, the relation between the holes 1g and the projections 2g may be reversed.

A pair of support members 3 formed of molding with use of a synthetic resin each have a cutout portion 3a formed at a side portion, a stepped portion 3b formed at a side portion, and a rectangular hole 3c formed in the upper surface. The paired support members 3 are mounted on both sides of the front portion of the lower cover 1, as shown in FIGS. 4 and 6.

A substrate member 4 having a conductive pattern (not shown) and various electric components (not shown) is placed at front positions of its side portions onto the stepped portions 3b of the paired support members 3 and is placed at rear positions of its side portions onto the receiving portions 1d. In this state the substrate member 4 is positioned and received in the lower cover 1.

At this time the receiving portions 1d are in contact with an earth pattern of the conductive pattern.

A socket 5 is constituted by a female socket forming part of a connector and it has terminals 6 to be connected to male connector terminals (not shown). On the front side of the lower cover 1, convex portions 5a are positioned in the cutout portions 3a of the support members 3 and in this state the terminals 6 are connected to the conductive pattern on the substrate member 4.

The support members 3, base member 4 and socket 5 are thus mounted to the lower and upper covers 1, 2. In this state, the projections 2g of the upper cover 2 are inserted into both holes 1g of the lower cover 1 and holes 3c of the support members 3 and are engaged therein, whereby both covers 1 and 2 are combined together to constitute a case 7 having an accommodating portion 7a.

When the case 7 is thus formed, the substrate member 4, socket 5 and support members 3 are accommodated in the accommodating portion 7a, and the arm portions 2d of the upper cover 2 come into contact with the earth pattern of the conductive pattern. The arm portions 2d press elastically the upper surface portions of the substrate member 4 which are opposed to the receiving portions 1d, and thus both side portions of the substrate member 4 are held grippingly at rear positions thereof between the receiving portions 1d and the arm portions 2d.

At this time, both side portions of the substrate member 4 are supported at front positions thereof by the paired support members 3.

The IC card constructed as above is inserted into and ejected from an IC card connector.

Several types of such IC cards are provided which have substrate members 4 with different electric components mounted thereon respectively according to for what purposes the IC cards are used.

In this case, the substrate members 4 have electric components of different heights, so in the present invention, to cope with the use of such different electric components, there are formed receiving portions 1d having a plurality of different stepped portions in the vertical direction of the case 7.

When an electric component of a small height is used, the associated substrate member 4 is put on the receiving portions 1d located at an upper position, while when an electric component of a large height is used, the associated substrate member 4 is put on the receiving portions 1d located at a lower position, thus changing the position where each substrate member is supported.

Referring now to FIG. 9, there is illustrated an IC card according to another embodiment of the present invention. In this embodiment, a frame 1f of a rear wall 1e of a lower cover 1 is provided with an L-shaped support portion 1h to support the rear portion of the substrate member 4.

Although a pair of support members 3 are used in the above embodiments, the support members 3 may be omitted and instead the shape of the upper cover 1 and that of the lower cover 2 may be changed to directly support the substrate member grippingly between both covers 1 and 2.

According to the present invention, as will be seen from the above description, there are attained the following effects.

Since the substrate member 4 received in the accommodating portion 7a of the case 7 is held grippingly between the upper cover 2 and the lower cover 1, it is no longer required to use the conventional frame 23 and it is possible to provide an IC card which is superior in productivity and less expensive.

Since the substrate member 4 is held between the plural receiving portions 1d and plural arm portions 2d, it is possible to provide an IC card of a simple construction and wherein the substrate member can be held stably.

Since the receiving portions 1d have stepped portions in the vertical direction, it is possible to hold different substrate members and provide an IC card which permits covers to be used in common.

Since the side portions of the substrate member 4 are supported at their front positions by the support members 3 provided on the front side of the case 7, it is possible to provide an IC card which is lower in the material cost and less expensive than in the use of the conventional frame 23 and which is superior in productivity, not requiring the provision of different frames 23 as in the prior art.

Moreover, since the support portion 1h is formed integrally with the lower cover to support the rear portion of the substrate member 4, it is possible to provide an IC card which permits the substrate member 4 to be supported firmly without the need of any special supporting member and which is less expensive and superior in productivity.

Further, since the receiving portions 1d and/or the arm portions 2d are brought into contact with the earth pattern, the connection to the earth pattern can be done simultaneously with gripping the substrate member 4. Thus, not only the connection is secured, but also there accrues an advantage in point of space factor and it is possible to provide a small-sized IC card.

What is claimed is:

1. An IC card comprising:

an upper cover formed of a metallic plate;

a lower cover formed of a metallic plate;

a substrate member having a conductive pattern and electronic components; and a socket connected with said conductive pattern, wherein said upper cover and said lower cover are combined together to form a case having an accommodating portion, said socket is attached to a front side of said case, and said substrate member is received in said accommodating portion and is held grippingly between said upper cover and said lower cover, and one of said upper and lower covers is provided with a plurality of receiving portions, the other cover of said upper and lower covers is provided with a plurality of presser arm portions, and side portions of said substrate member are held grippingly between said receiving portions and said presser arm portions.

2. An IC card according to claim 1, wherein said receiving portions have a plurality of stepped portions in a vertical direction of said case to permit a plurality of substrate members to be supported on said stepped portions respectively.

3. An IC card according to claim 1, wherein a support member formed of a synthetic resin is attached to a front side of said case to support the side portions of said substrate member at front positions thereof, and the side portions of the substrate member are supported at rear positions thereof by both said receiving portion and said presser arm portions.

4. An IC card according to claim 1, wherein a rear portion of one of said upper cover and said lower cover is provided with a support portion to support a rear portion of said substrate member.

5. An IC card according to claim 1, wherein one of said receiving portions and said presser arm portions contact an earth pattern of said conductive pattern.

* * * * *